(12) United States Patent
Heuser et al.

(10) Patent No.: US 11,340,303 B2
(45) Date of Patent: May 24, 2022

(54) METHOD AND DEVICE FOR DETERMINING AT LEAST ONE STATE VARIABLE OF A STORAGE ELEMENT FOR ELECTRICAL ENERGY

(71) Applicant: VOLKSWAGEN AG, Wolfsburg (DE)

(72) Inventors: Martin Heuser, Bochum (DE); Gianpiero Toso, Bochum (DE)

(73) Assignee: Volkswagen AG

( * ) Notice: Subject to any disclaimer, the term of this patent is extended or adjusted under 35 U.S.C. 154(b) by 1336 days.

(21) Appl. No.: 15/649,833

(22) Filed: Jul. 14, 2017

(65) Prior Publication Data

US 2018/0017626 A1    Jan. 18, 2018

(30) Foreign Application Priority Data

Jul. 18, 2016 (DE) ..................... 10 2016 213 078.1

(51) Int. Cl.
| | |
|---|---|
| G01R 31/392 | (2019.01) |
| G01R 31/382 | (2019.01) |
| G01R 31/389 | (2019.01) |
| B60L 3/12 | (2006.01) |
| B60L 58/10 | (2019.01) |
| G01R 31/374 | (2019.01) |
| B60R 16/03 | (2006.01) |
| G01R 31/36 | (2020.01) |
| G05B 13/02 | (2006.01) |

(52) U.S. Cl.
CPC .............. *G01R 31/392* (2019.01); *B60L 3/12* (2013.01); *B60L 58/10* (2019.02); *B60R 16/03* (2013.01); *G01R 31/3644* (2013.01); *G01R 31/374* (2019.01); *G01R 31/382* (2019.01); *G01R 31/389* (2019.01); *G05B 13/026* (2013.01); *Y02T 10/70* (2013.01)

(58) Field of Classification Search
CPC .................................................... G01R 31/392
See application file for complete search history.

(56) References Cited

U.S. PATENT DOCUMENTS

| | | | |
|---|---|---|---|
| 2010/0121588 A1 | 5/2010 | Elder et al. | |
| 2010/0138142 A1 | 6/2010 | Pease | |
| 2011/0082621 A1 | 4/2011 | Berkobin et al. | |
| (Continued) | | | |

FOREIGN PATENT DOCUMENTS

| | | |
|---|---|---|
| CN | 201971921 U | 9/2011 |
| CN | 104807559 A | 7/2015 |
| CN | 104914383 A | 9/2015 |
| (Continued) | | |

*Primary Examiner* — John E Breene
*Assistant Examiner* — Jeffrey C Morgan
(74) *Attorney, Agent, or Firm* — Barnes & Thornburg, LLP

(57) ABSTRACT

A method and an apparatus for determining at least one state variable of a storage element for electrical energy having at least one control device, at least one storage element for electrical energy, and at least one temperature sensor, wherein the temperature sensor detects the temperature of the storage element continuously or periodically, wherein the control device determines the state variable of the storage element at least based on the detected temperature, wherein the control device fills measurement gaps of the temperature sensor using data of a weather service, the data then is used in the determination of the at least one state variable.

10 Claims, 1 Drawing Sheet

(56) References Cited

U.S. PATENT DOCUMENTS

2012/0200257 A1* 8/2012 Schwarz ............. H01M 10/486
                                                320/109
2016/0016485 A1* 1/2016 Deisler ................. G01C 21/26
                                                701/22

FOREIGN PATENT DOCUMENTS

| CN | 105043538 A | 11/2015 |
| CN | 105050865 A | 11/2015 |
| DE | 102010045514 A1 | 3/2012 |
| DE | 102010048387 A1 | 4/2012 |
| DE | 102015208758 A1 | 11/2015 |
| DE | 102014217135 A1 | 3/2016 |
| WO | 2015185802 A1 | 12/2015 |

* cited by examiner

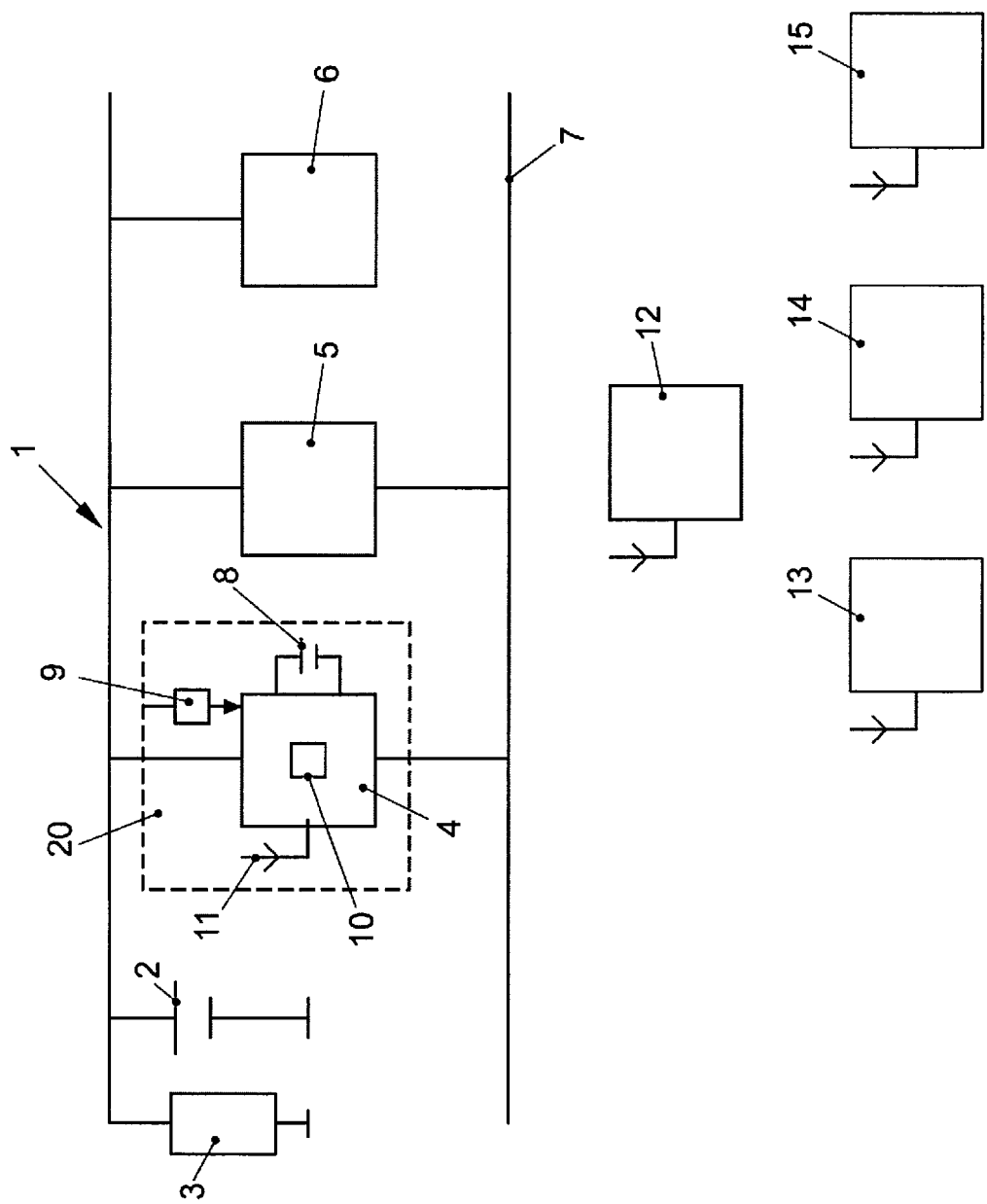

METHOD AND DEVICE FOR DETERMINING AT LEAST ONE STATE VARIABLE OF A STORAGE ELEMENT FOR ELECTRICAL ENERGY

PRIORITY CLAIM

This patent application claims priority to German Patent Application No. 10 2016 213 078.1, filed 18 Jul. 2016, the disclosure of which is incorporated herein by reference in its entirety.

SUMMARY

Illustrative embodiments relate to a method and an apparatus for determining at least one state variable of a storage element for electrical energy.

BRIEF DESCRIPTION OF THE DRAWINGS

Disclosed embodiments are described in more detail below with reference to the single FIGURE, in which:

FIG. 1 shows a schematic block diagram of a motor vehicle on-board power supply system with an external server and external weather services.

DETAILED DESCRIPTION

Knowing state variables of a battery is extremely important, for example, to ascertain operating strategies and/or replacement thereof. The most important state variables in this case are the state of health (SOH) and the state of charge (SOC).

The storage element here may be a primary battery, a rechargeable battery or a double-layer capacitor. A very important parameter that influences the state variables is the temperature, wherein it generally holds true that higher temperatures accelerate aging. A further influencing variable is, for example, the number of charging/discharging cycles, wherein the influence thereof is different for the individual storage elements. This can be taken into account in appropriate models.

WO 2015/185802 A1 discloses a method where a future state variable of a storage element is estimated. Here, various parameters are measured, such as the temperature of the storage element, for example, wherein weather forecasts are used to perform a short-term or a longer-term temperature forecast. The document also discloses replacing the temperature measurement with the data of a weather service. Although this conserves the separate temperature sensor, it reduces the accuracy of the determination of the state variable.

DE 10 2014 217 135 A1 discloses an alternative method for determining the SOH value and the SOC value. Here, the impedance of a battery is identified, in particular the imaginary part thereof, and is compared with a reference value. The increased complexity in terms of circuitry to determine the impedance is disadvantageous.

A problem of the methods where the temperature is used to determine the state variables is that there are not always temperature values available for specific time periods. For example, to reduce the quiescent current demand, it may be necessary to adjust the temperature measurements or to switch off a control device that evaluates the temperature measurement or to switch the control device to a sleep mode. This creates measurement gaps.

Disclosed embodiments provide a method for determining at least one state variable of a storage element in which the measurement gaps are filled. A further technical problem lies in the provision of a suitable apparatus.

The method for determining at least one state variable of a storage element for electrical energy is characterized in that the state variable is determined at least depending on the temperature of the storage element. In this case, the temperature is detected continuously or periodically by a temperature sensor, wherein measurement gaps of the temperature sensor are filled using data of a weather service, the data then being used in the determination of the at least one state variable. This allows a better estimation of the prevailing temperature in comparison with a worst-case estimation, where the measurement gaps would be filled with the maximum temperature that can arise, for example. In turn, this leads to the user not being prompted to change the storage element too early. The storage element in this case is an electrochemical storage element, such as a rechargeable Li ion battery or a rechargeable lead-acid battery, for example.

In at least one disclosed embodiment, the SOH value is determined as the state variable, since the SOH value is critical.

In a further disclosed embodiment, the data of a weather service are provided by a server that processes the data of at least one weather service. The server can also process different data formats of different weather services in a uniform manner, with the result that it is necessary for tuning with just one server or provider to take place. In principle, however, direct communication with a weather service is also possible. In this case, the position of the storage element is communicated to the server or weather service, which then transmits the temperature data that are relevant to the position.

In a further disclosed embodiment, a correction factor is applied to the temperature data of the weather service, the correction factor being dependent at least on cloud cover and/or the position of the sun. This is based on the knowledge that the input of heat into an apparatus with the storage element, such as a motor vehicle, for example, does not only depend on the outside temperature but also depends significantly on the position of the sun and/or cloud cover. A motor vehicle clearly heats up more intensely when the motor vehicle is exposed to the sun with the sun in a high position and without shade and without cloud cover than with the sun in a lower position and/or with cloud cover, even when the outside temperature in the shade is the same. It should be noted here that, when the weather data are taken into account, a worst-case estimation is likewise carried out. In this case, it is assumed that the storage element is arranged in a motor vehicle. If it is then not possible to determine the position more accurately from other information, the motor vehicle could be stationary in a parking lot in the blazing sun or else in a cool parking garage. In this case, the worst case is used for the temperature values, that is to say the parking lot. However, for the temperature input, particularly factors such as cloud cover or precipitation are taken into account here by the correction values. As a result, there is an improved estimation but it always remains on the safe side, that is to say that the SOH value is never excessively determined.

In a further disclosed embodiment, a warning signal is generated when at least one threshold value of the state variable is undershot, to alert the user of a change that will soon be necessary, for example.

The apparatus for determining at least one state variable of a storage element for electrical energy comprises at least one control device, at least one storage element for electrical energy and at least one temperature sensor, wherein the temperature sensor is configured in such a way as to detect the temperature of the storage element continuously or periodically, wherein the control device is configured in such a way as to determine the state variable of the storage element at least based on the detected temperature. The control device is configured here in such a way as to fill measurement gaps of the temperature sensor using data of a weather service, the data then being used in the determination of the at least one state variable.

In at least one disclosed embodiment, the state variable is the SOH value of the storage element.

In a further disclosed embodiment, the apparatus has an air interface that is configured in such a way as to establish a communication connection to a weather service or a server, wherein the server provides processed data of at least one weather service.

In a further disclosed embodiment, the apparatus has a position determination device. By way of the position determination device, the apparatus can scan the weather data for its specific position, which further increases the accuracy of the temperature estimation for the measurement gaps. The position determination device is a satellite-based position determination device, for example.

In a further disclosed embodiment, the control device is configured in such a way as to generate a warning signal depending on the determined state variables. For example, the warning signal is used to inform the user that the SOH value has undershot a threshold value and it is necessary to change the storage element. The warning signal can be locally output optically and/or acoustically and/or transmitted to an end device of the user, for example, to a smartphone.

An area of application may be the use in a motor vehicle, wherein a further area of application is an apparatus for transmitting an automatic distress signal.

FIG. 1 illustrates a motor vehicle on-board power supply system 1 that has an on-board power supply system battery 2 and consumers 3. The on-board power supply system further has a plurality of control devices 4-6, which are connected to one another for data processing purposes by a bus line 7, wherein the supply voltage of the control devices 4-6 is provided by the on-board power supply system battery 2. Furthermore, the control device 4 has a local storage element 8 for electrical energy. A temperature sensor 9 is locally associated with the storage element 8, the temperature sensor transmitting temperature data of the storage element 8 continuously or periodically to the control device 4. The control device 4 additionally has a position determination device 10, which is configured as a GPS receiver, for example. The control device 4 is further configured with an air interface 11. The control device 4 in this case also monitors charging and discharging processes of the storage element 8. The control device 4, temperature sensor 9 and storage element 8 form here an apparatus 20 for determining a state variable of the storage element 8. Here, the control device 4 can establish a data connection to an external server 12 by the air interface 11, the server likewise being connected to weather services 13-15 by air interfaces. However, the connection between the weather services 13-15 and the server 12 can in this case also be wired.

The control device 4 serves to transmit an automatic distress signal in the event of an accident. For this to still be able to take place in the event of a sharp drop in the supply voltage of the motor vehicle on-board power supply system 1 on account of the accident, the control device 4 comprises the storage element 8 that provides enough power for the distress call.

Therefore, the SOH value of the storage element 8 must be monitored so that an excessively aged storage element 8 can be exchanged in good time. To that end, the control device 4 evaluates the temperature measurement and the discharging/charging cycles and/or the charge and discharge current of the storage element 8 to determine the SOH value therefrom.

To limit the quiescent current consumption, it is known, in specific situations, to switch control devices to a sleep mode or to switch them off completely. In such a case, the control device 4 cannot evaluate the present temperature values, even if the temperature sensor 9 were active, that is to say that, during these phases, measurement gaps occur in the evaluation of the SOH value. The measurement gaps must be filled because the storage element 8 also ages during the phases depending on the temperature.

To that end, the control device 4 draws on data of a weather service 13-15, after the control device 4 has been woken up again or been switched on, for example. The control device 4 then sends a request to the server 12, wherein the request contains the position of the motor vehicle and the time period in question for which measurement gaps exist in the temperature measurement. The server 12 then processes the weather data relevant for the position. In this case, the server 12 estimates what temperatures have arisen in the motor vehicle (and therefore also for the storage element), for which purpose the position of the sun and cloud cover are also taken into account in addition to the outside temperature. Here, the server 12 assumes the worst-case scenario of the motor vehicle having been directly exposed to by the sun. The temperature values estimated in this way are transmitted to the air interface 11 and are used in the control device 4 for determining the SOH value.

It should be noted here that the position determination device 10 does not have to be arranged in the control device 4 itself, but instead can also transmit the data to the control device 4 by the bus line 7. Furthermore, the temperature sensor 9 can also be arranged at a location that is remote from the storage element 8, wherein the temperature at the storage element 8 is then deduced from the temperature at the measurement location by appropriate correction values.

The invention claimed is:

1. A method for determining at least one state variable of a storage element for electrical energy, the method comprising:
   continuously or periodically detecting a temperature of the storage element by a temperature sensor;
   determining the state variable at least based on the temperature of the storage element; and
   filling measurement gaps of the temperature sensor using weather service temperature data to make the determination of the at least one state variable.

2. The method of claim 1, wherein the state variable is state of health of the storage element.

3. The method of claim 1, wherein the weather service data are provided by a server that processes data of at least one weather service.

4. The method of claim 3, further comprising applying a correction factor to the weather service temperature data, the correction factor being dependent at least on cloud cover and/or a position of the sun.

5. The method of claim 1, further comprising generating a warning signal depending on the determined state variable.

6. An apparatus for determining at least one state variable of a storage element for electrical energy, the apparatus comprising:
- at least one control device;
- at least one storage element for electrical energy; and
- at least one temperature sensor,
- wherein the at least one temperature sensor detects the temperature of the at least one storage element continuously or periodically,
- wherein the at least one control device determines the state variable of the at least one storage element at least based on the detected temperature, and
- wherein the at least one control device fills measurement gaps of the at least one temperature sensor using weather service data, which is then used to determine the at least one state variable.

7. The apparatus of claim 6, wherein the state variable is a state of health value of the storage element.

8. The apparatus of claim 6, further comprising an air interface that establishes a communication connection to a weather service or a server, wherein the server provides processed data of at least one weather service.

9. The apparatus of claim 6, further comprising a position determination device.

10. The apparatus of claim 6, wherein the at least one control device generates a warning signal depending on the determined state variable.

* * * * *